(12) United States Patent
Hayashi et al.

(10) Patent No.: US 12,317,380 B2
(45) Date of Patent: May 27, 2025

(54) CYLINDRICAL HEATER

(71) Applicant: MEKTEC CORPORATION, Tokyo (JP)

(72) Inventors: Tatsuro Hayashi, Tokyo (JP); Shota Seki, Tokyo (JP); Hirokazu Iwaki, Tokyo (JP); Takashi Sasaki, Tokyo (JP)

(73) Assignee: MEKTEC CORPORATION, Tokyo (JP)

( * ) Notice: Subject to any disclaimer, the term of this patent is extended or adjusted under 35 U.S.C. 154(b) by 653 days.

(21) Appl. No.: 17/414,582

(22) PCT Filed: Apr. 17, 2020

(86) PCT No.: PCT/JP2020/016923
§ 371 (c)(1),
(2) Date: Jun. 16, 2021

(87) PCT Pub. No.: WO2020/261725
PCT Pub. Date: Dec. 30, 2020

(65) Prior Publication Data
US 2022/0046766 A1  Feb. 10, 2022

(30) Foreign Application Priority Data

Jun. 27, 2019 (JP) .................. 2019-120053

(51) Int. Cl.
*H05B 3/54* (2006.01)
*H05B 3/06* (2006.01)
*H05K 1/14* (2006.01)

(52) U.S. Cl.
CPC ............... *H05B 3/54* (2013.01); *H05B 3/06* (2013.01); *H05K 1/147* (2013.01)

(58) Field of Classification Search
CPC ............. H05K 1/147; H05B 3/06; H05B 3/54
(Continued)

(56) References Cited

U.S. PATENT DOCUMENTS 10,021,739 B2    7/2018  Kiernan et al.
2009/0039074 A1*  2/2009  Sasaki ................ H05B 3/42
                                                 219/544
(Continued)

FOREIGN PATENT DOCUMENTS

CN      108141915 A    6/2018
DE   202005021031 U1 *  2/2007  .............. B62J 33/00
(Continued)

OTHER PUBLICATIONS

An Office Action mailed by China National Intellectual Property Administration on Nov. 9, 2023, which corresponds to Chinese Patent Application No. 202080006870.3 and is related to U.S. Appl. No. 17/414,582; with English language translation.
(Continued)

*Primary Examiner* — Jimmy Chou
(74) *Attorney, Agent, or Firm* — Studebaker Brackett PLLC

(57) ABSTRACT

Provided is a tubular heater whose attachment process is facilitated and whose heating efficiency is high. Features of the tubular heater are that the tubular heater includes a tubular elastic body 200 and a flexible printed circuit board 100 provided integrally with the elastic body 200 and formed with a heating circuit and a heating unit 110 of the flexible printed circuit board 100 formed with the heating circuit is provided in the elastic body 200 in a state in which the heating unit 110 is exposed on an inner peripheral side and extends along an inner peripheral surface of the elastic body 200 with tip ends of the heating unit 110 being separated from each other with a clearance S in a circumferential direction.

2 Claims, 4 Drawing Sheets

(58) Field of Classification Search
USPC ........................................................ 219/534
See application file for complete search history.

(56) References Cited

U.S. PATENT DOCUMENTS

| | | | | |
|---|---|---|---|---|
| 2010/0116818 A1* | 5/2010 | Gabbay | ............... | A47J 37/0709 |
| | | | | 219/528 |
| 2015/0083704 A1* | 3/2015 | Guidry | ............. | A41D 19/01535 |
| | | | | 219/211 |
| 2017/0013678 A1 | 1/2017 | Kiernan et al. | | |

FOREIGN PATENT DOCUMENTS

| | | | | | |
|---|---|---|---|---|---|
| DE | 102017130508 A1 | * | 6/2019 | ............... | H05B 3/34 |
| JP | H1067366 A | * | 3/1988 | ............. | B62K 23/04 |
| JP | H02-071199 U | | 5/1990 | | |
| JP | H02121497 U | * | 10/1990 | ............... | B62J 33/00 |
| JP | H0451886 U | * | 2/1992 | ................ | C12J 1/00 |
| JP | H04-038697 U | | 3/1992 | | |
| JP | H0526775 U | * | 4/1993 | ............. | B62J 33/00 |
| JP | H09156562 A | * | 6/1997 | ............. | B62J 33/00 |
| JP | H11-219775 A | | 8/1999 | | |
| JP | H11-296011 A | | 10/1999 | | |
| JP | 2008-153042 A | | 7/2008 | | |
| JP | 2009-041619 A | | 2/2009 | | |
| JP | 2009168480 A | * | 7/2009 | ............. | G01F 1/684 |
| JP | 2011-165542 A | | 8/2011 | | |
| JP | 2012-004028 A | | 1/2012 | | |
| JP | 2014135157 A | * | 7/2014 | ............... | H05B 3/06 |

OTHER PUBLICATIONS

International Search Report issued in PCT/JP2020/016923; mailed Jul. 14, 2020.

* cited by examiner (a)

(b)

(a)

(b)

CYLINDRICAL HEATER

TECHNICAL FIELD

The present invention relates to a tubular heater having a flexible printed circuit board formed with a heating circuit.

BACKGROUND ART

Typically, a tubular heater provided to cover an outer peripheral surface of a tubular member or a columnar member to heat such a member has been known. A tubular heater according to a typical example will be described with reference to FIG. 6. FIG. 6 shows a schematic sectional view of the tubular heater according to the typical example.

The shown tubular heater 700 includes a double-sided tape 710, a flexible printed circuit board 720 bonded to the double-sided tape 710, and a holding member 730 configured to hold the flexible printed circuit board 720. A heating circuit is formed at the flexible printed circuit board 720, and has the function of generating heat by voltage application. The holding member 730 includes a tubular member.

The steps of attaching the tubular heater 700 configured as described above to a circular columnar heating target 550 will be described. First, the double-sided tape 710 is bonded to an outer peripheral surface of the heating target 550. Next, the flexible printed circuit board 720 is bonded to the double-sided tape 710. Thereafter, the holding member 730 is attached to avoid detachment of the flexible printed circuit board 720 from the double-sided tape 710 due to, e.g., elastic restoring force of the flexible printed circuit board 720 itself. After the tubular heater 700 has been attached to the heating target 550 by the above-described steps, when voltage is applied to the heating circuit of the flexible printed circuit board 720, the heating circuit generates heat to heat the heating target 550.

The tubular heater 700 of the typical example configured as described above has such disadvantages that the process of bonding the double-sided tape 710 is complicated and the number of working processes is great due to a great number of components. Moreover, the tubular heater 700 also has such a disadvantage that the double-sided tape 710 is bonded again in a case where the position of attachment of the double-sided tape 710 is incorrect. The double-sided tape 710 is interposed between the heating target 550 and the flexible printed circuit board 720, and such a configuration leads to degradation of a heating efficiency.

In addition, for example, a technique (see Patent Literature 1) using a heat shrinkable tube and a technique (see Patent Literature 2) of covering a heat generation body with synthetic rubber after the heat generation body has been bonded to a core body have been known. However, these techniques also have such disadvantages that the number of manufacturing steps is great due to a great number of components and a heating efficiency is low due to other members interposed between, for example, a heating target and the heat generation body.

CITATION LIST

Patent Literature

PATENT LITERATURE 1: JP-A-2011-165542
PATENT LITERATURE 2: JP-A-2008-153042

SUMMARY OF INVENTION

Problems to be Solved by Invention

An object of the present invention is to provide a tubular heater whose attachment process is facilitated and whose heating efficiency is high.

Solution to Problems

For solving the above-described problems, the present invention employs the following technique.

A tubular heater of the present invention has a feature of including a tubular elastic body; and
a flexible printed circuit board provided integrally with the elastic body and formed with a heating circuit,
wherein a heating unit of the flexible printed circuit board formed with the heating circuit is provided in the elastic body in a state in which the heating unit is exposed on an inner peripheral side and extends along an inner peripheral surface of the elastic body with tip ends of the heating unit being separated from each other with a clearance in a circumferential direction.

According to the present invention, the tubular heater can be attached to a heating target while deformed such that the inside of the tubular elastic body is expanded. Thus, the attachment process is facilitated. The heating unit of the flexible printed circuit board is exposed on the inner peripheral side of the elastic body. Thus, the heating unit can directly come into contact with the heating target. Thus, the heating efficiency can be enhanced.

Effects of Invention

As described above, according to the present invention, the tubular heater whose attachment process is facilitated and whose heating efficiency is high can be achieved.

DESCRIPTION OF EMBODIMENTS

Hereinafter, a mode for carrying out the present invention will be described in detail as an example based on an embodiment with reference to the drawings. Note that the dimensions, materials, shapes, relative arrangements, etc. of components described in the present embodiment are not intended to limit the scope of the present invention only to these components unless otherwise specified.

Embodiment

Figure 1:
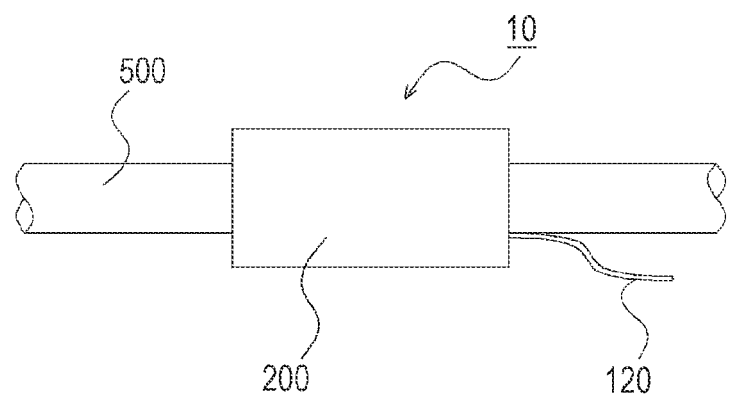
FIG. 1 shows an external view of a use example of a tubular heater according to an embodiment of the present invention.
Figure 2:
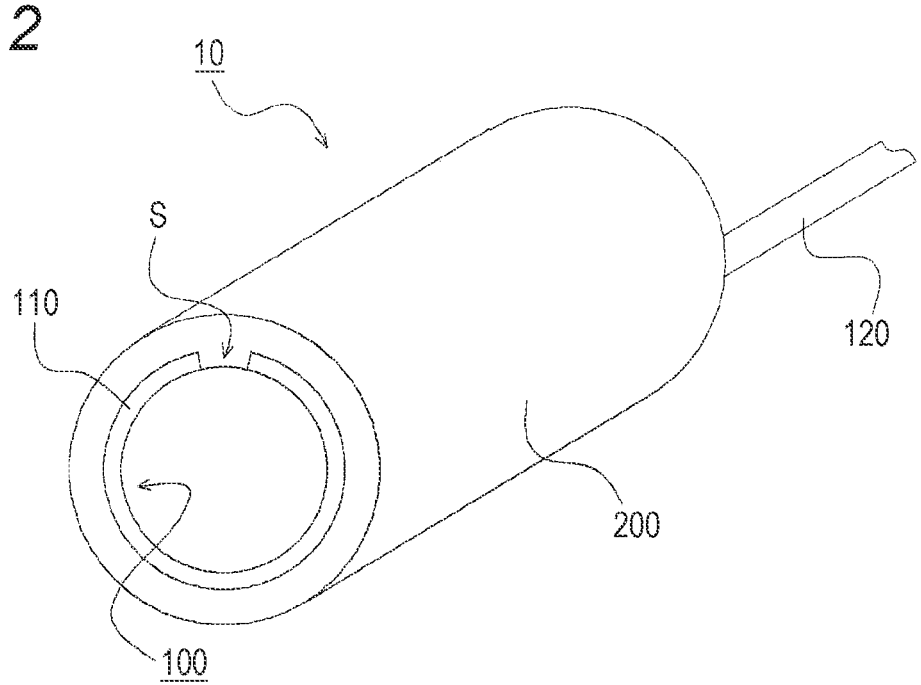
FIG. 2 shows a perspective view of the tubular heater according to the embodiment of the present invention.
Figure 3:
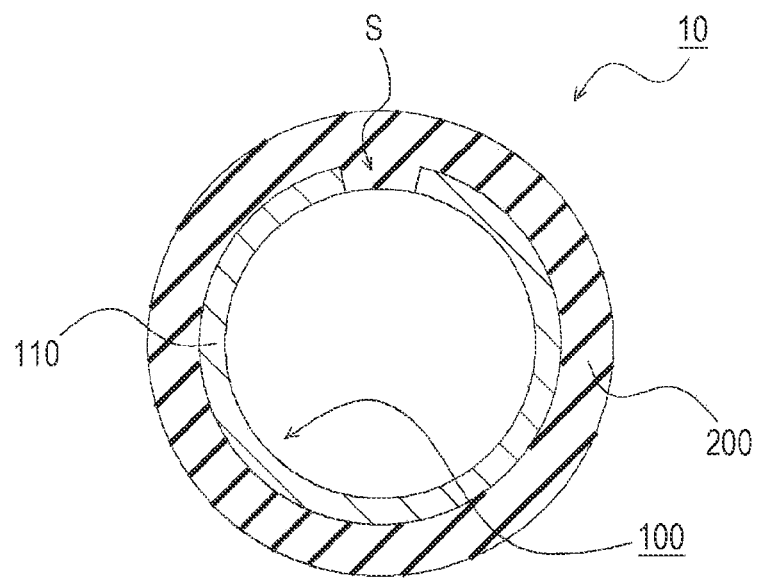
FIG. 3 shows a schematic sectional view of the tubular heater according to the embodiment of the present invention.
Figure 4:
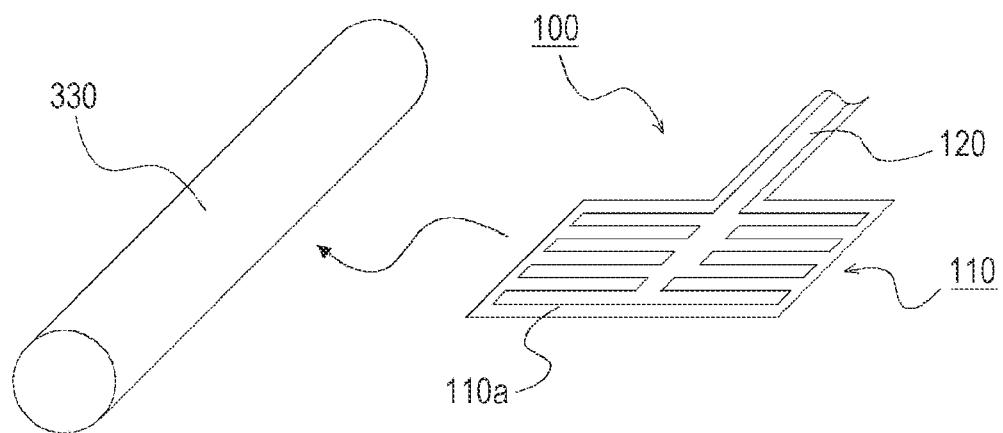
FIG. 4 shows views of the steps of manufacturing the tubular heater according to the embodiment of the present invention.
Figure 4:
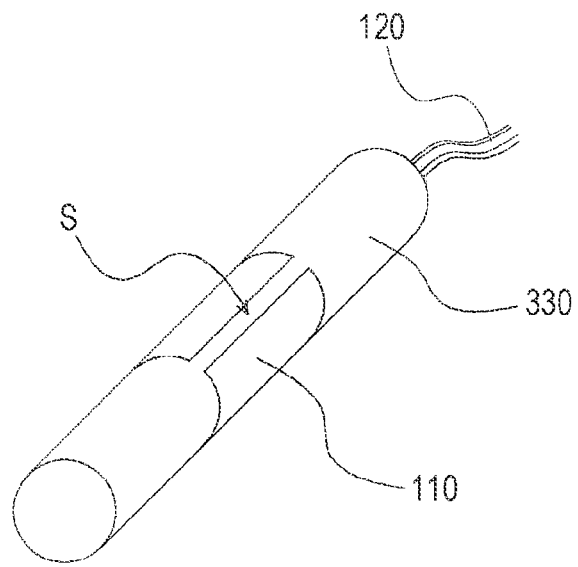
Figure 5:
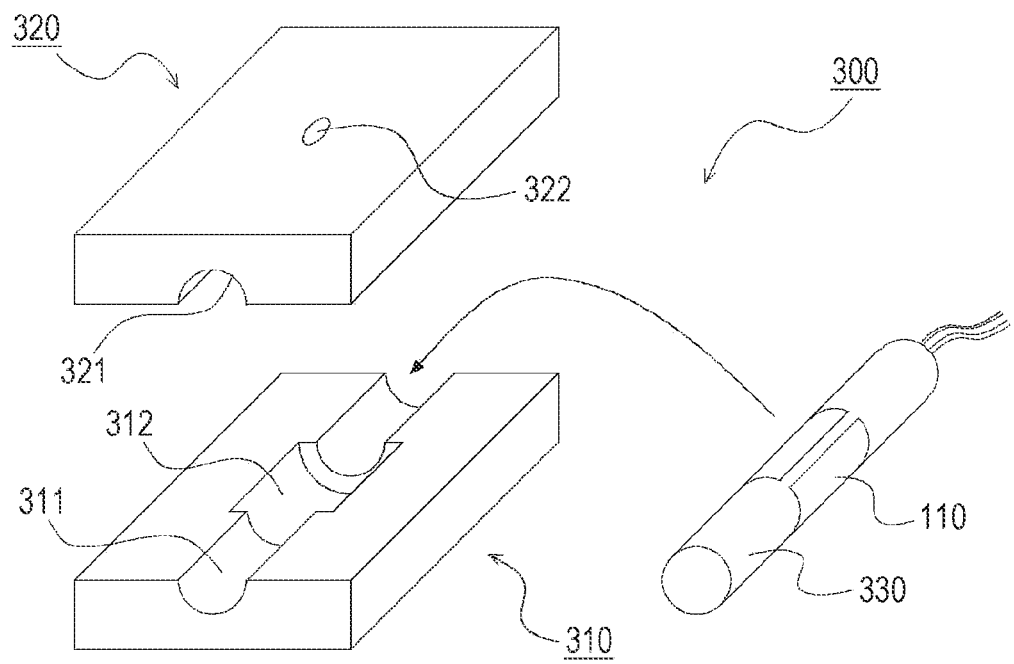
FIG. 5 shows views of the steps of manufacturing the tubular heater according to the embodiment of the present invention.
Figure 5:
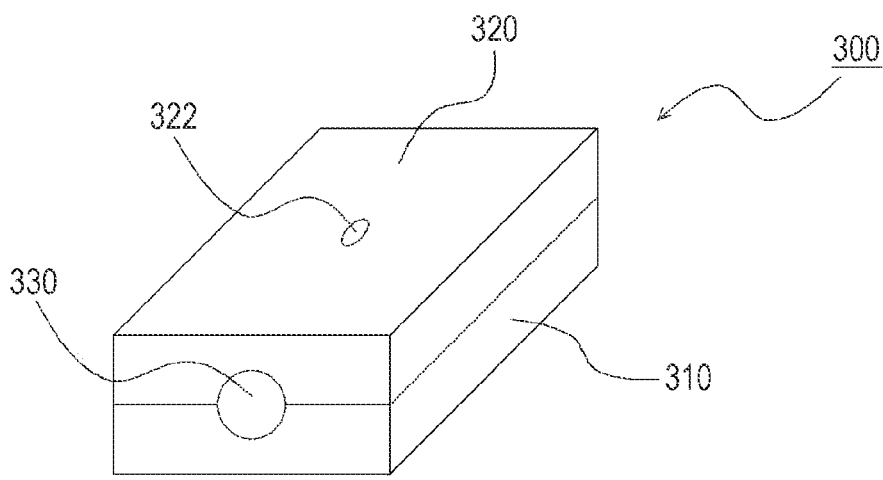
Figure 6:
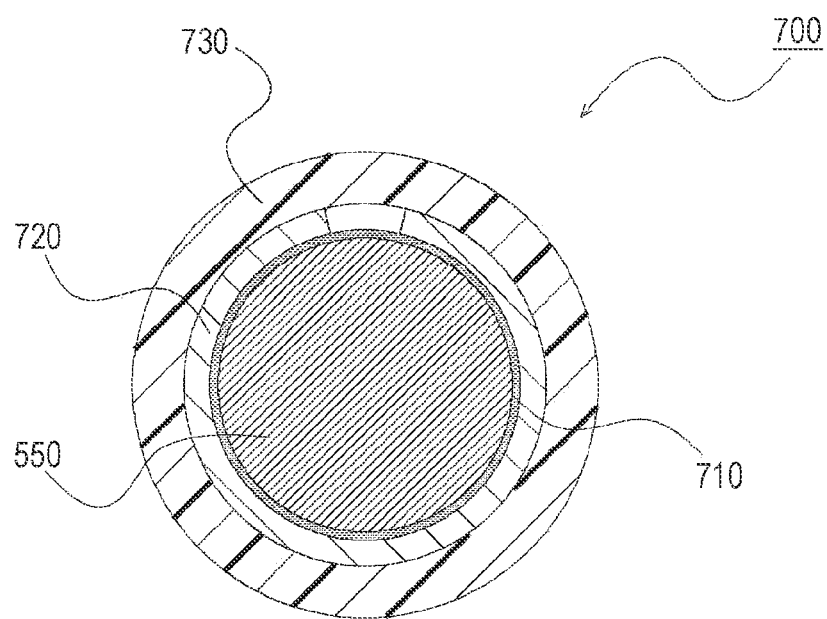
FIG. 6 shows a schematic sectional view of a tubular heater according to a typical example.

A tubular heater according to the embodiment of the present invention will be described with reference to FIGS. 1 to 5. FIG. 1 shows an external view of a use example of the tubular heater according to the embodiment of the present invention, and shows the vicinity of the tubular heater attached to a heating target. FIG. 2 shows a perspective view of the tubular heater according to the embodiment of the present invention. FIG. 3 shows a schematic sectional view of the tubular heater according to the embodiment of the present invention. Note that the tubular heater according to the present embodiment has a cylindrical shape. FIG. 3 shows the sectional view of the tubular heater cut along a plane perpendicular to the center axis of a cylinder. FIGS. 4 and 5 show views of the steps of manufacturing the tubular heater according to the embodiment of the present invention.

Use Example of Tubular Heater

As shown in FIG. 1, the tubular heater 10 according to the present embodiment is attached to cover an outer peripheral surface of the heating target 500. The shape of the heating target 500 is not specifically limited, and the heating target 500 is preferably a tubular member or a columnar member. For example, the tubular heater 10 can be used to heat a lens barrel or a pipe through which liquid passes. In the former case, the lens barrel as the heating target is heated by the tubular heater 10, so that fogging of a lens can be reduced. In the latter case, the pipe as the heating target is heated by the tubular heater 10, so that freezing of the liquid passing through the pipe can be reduced. In the shown example, a state in which the cylindrical tubular heater 10 is attached to the cylindrical heating target 500 is shown.

<Tubular Heater>

A configuration of the tubular heater 10 according to the present embodiment will be described. The tubular heater 10 according to the present embodiment includes a tubular elastic body 200 and a flexible printed circuit board 100 provided integrally with the elastic body 200. The elastic body 200 is made of an elastomer material such as rubber. The flexible printed circuit board 100 includes a heating unit 110 formed with a heating circuit 110a and a power transmission unit 120 configured to apply voltage to the heating circuit 110a. Note that the power transmission unit 120 is electrically connected to, e.g., a not-shown power source.

The heating unit 110 in the flexible printed circuit board 100 is provided in the elastic body 200 in a state in which the heating unit 110 is exposed on an inner peripheral side, and in a state in Which the heating unit 110 extends along an inner peripheral surface of the elastic body 200 with tip ends of the heating unit 110 being separated from each other with a clearance S in a circumferential direction. Note that the power transmission unit 120 is provided in a state in which the power transmission unit 120 is drawn out of the elastic body 200.

According to the tubular heater 10 configured as described above, the elastic body 200 can be deformed such that the vicinity of the above-described clearance S is extended. With this configuration, the tubular heater 10 can be deformed such that the inside of the tubular elastic body 200 is expanded.

<Method for Manufacturing Tubular Heater>

One example of the me shod for manufacturing the tubular heater 10 according to the present embodiment will be described specifically with reference to FIGS. 4 and 5. The tubular heater 10 according to the present embodiment can be obtained in such a manner that the flexible printed circuit board 100 is used as an insert component and the elastic body 200 is insert-molded using an injection molding method, for example. More specifically, as shown in FIGS. 4 and 5, insert molding can be performed using a mold 300 including a lower mold 310, an upper mold 320, and a core 330. Hereinafter, the manufacturing steps in the case of performing insert molding by means of such a mold will be sequentially described.

First, the heating unit 110 of the flexible printed circuit board 100 is wound around the core 330. FIG. 4(a) shows a state in the process of causing the flexible printed circuit board 100 to approach the core 330. FIG. 4(b) shows a state in which the heating unit 110 of the flexible printed circuit board 100 is wound around the core 330. As shown in FIG. 4(b), the heating unit 110 is wound around the core 330 in a state in which the tip ends of the heating unit 110 are separated from each other with the clearance S in the circumferential direction.

Next, the core 330 around which the heating unit 110 is wound is arranged between the lower mold 310 and the upper mold 320. A groove 311 having a semicircular section for the attachment of the core 330 is provided on an upper side of the lower mold 310. Moreover, a deep groove 312 for molding the elastic body 200 is provided at the center of the groove 311. A space formed between the deep groove 312 and the core 330 forms a cavity. Similarly, a groove 321 having a semicircular section for the attachment of the core 330 is provided on a lower side of the upper mold 320, and a deep groove (not shown) for forming the cavity is provided at the center thereof. An injection port 322 for injecting a molding material (in the present embodiment, an elastomer material such as rubber) into the cavity is provided at the upper mold 320.

FIG. 5(a) shows a state in the process of arranging the core 330, around which the heating unit 110 is wound, between the lower mold 310 and the upper mold 320. FIG. 5(b) shows a mold clamping state. After molding clamping, the molding material is injected through the injection port 322 by an injection molding machine, and insert molding is performed. Thereafter, a molded article is taken out of the mold, and aftertreatment such as deburring is performed. In this manner, the tubular heater 10 as shown in FIG. 2 can be obtained. Note that the case of using the injection molding method has been described herein as one example. However, the tubular heater 10 is not limited to the injection molding method, and can be also manufactured using other molding methods such as an extrusion molding method. Moreover, the above-described contents regarding the structure of the mold are merely one example, and various mold structures can be employed.

Advantages of Tubular Heater According to Present Embodiment

According to the tubular heater 10 of the present embodiment, the tubular heater 10 can be attached to the heating target 500 while deformed such that the inside of the tubular elastic body 200 is expanded. Thus, an attachment process is facilitated. The heating unit 110 of the flexible printed circuit board 100 is exposed on the inner peripheral side of the elastic body 200. With this configuration, the heating unit 110 can directly come contact with the heating target 500. Thus, a heating efficiency can be enhanced. Further, the number of manufacturing steps is reduced because the number of components is small.

Note that for easily and reliably attaching the tubular heater to the heating target and sufficiently enhancing the heating efficiency, the sectional shape of the outer peripheral surface of the heating target and the sectional shape of an inner peripheral surface of the tubular heater are preferably similar shapes and the dimensions of the latter are preferably moderately smaller than the dimensions of the former. Note that the above-described "sectional shape" means the shape of the section of the tubular heater perpendicular to a direction in which the tube extends.

For example, in the case of the above-described embodiment, any of the sectional shape of the outer peripheral surface of the heating target 500 and the sectional shape of the inner peripheral surface of the tubular heater 10 is a circular shape. When the diameter (the outer diameter of the heating target 500) of the circle of the former is D1 and the diameter (the inner diameter of the tubular heater 10) of the circle of the latter is D2, a setting satisfying D1>D2 is made. For example, a setting of D1×0.93≥D2 is made, so that deformation can be made such that the inside of the elastic, body 200 is expanded until the above-described clearance S is substantially quadrupled and the tubular heater 10 can be attached to the heating target 500 in a state in which a position shift is reduceable.

Note that the sectional shape of the outer peripheral surface of the heating target and the sectional shape of the inner peripheral surface of the tubular heater are not limited to the circular shape. As these sectional shapes, an oval shape (e.g., an oval, an ellipse, or a track shape) and a rectangular shape can be also applied, for example. As described above, the sectional shape of the outer peripheral surface of the heating target and the sectional shape of the inner peripheral surface of the tubular heater are preferably the similar shapes. However, both of these shapes may be different from each other to some extent because the tubular heater can be elastically deformed.

For more efficiently heating the heating target 500, a material with a low thermal conductivity may be employed as the material of the elastic body 200. With this configuration, heat dissipation to an outer peripheral side of the elastic body 200 can be reduced, and therefore, the heating target 500 can be more efficiently heated. In a case where another heating target is also provided on the outer peripheral side of the elastic body 200, a material with a high thermal conductivity may be employed as the material of the elastic body 200. In this case, heat from the heating unit 110 is easily transmitted to the outer peripheral side of the elastic body 200, and therefore, not only the heating target 500 on the inner peripheral side of the elastic body 200 but also the heating target on the outer peripheral side can be heated.

Note that in the above-described embodiment, the configuration in the case of providing the single flexible printed circuit board 100 integrally with the elastic body 200 has been described. However, the present invention includes the case of providing multiple flexible printed circuit boards integrally with an elastic body.

LIST OF REFERENCE SIGNS

10 Tubular Heater
100 Flexible Printed Circuit Board
110 Heating Unit
110a Heating Circuit
120 Power Transmission Unit
200 Elastic Body
300 Mold
310 Lower Mold
311 Groove
312 Deep Groove
320 Upper Mold
321 Groove
322 Injection Port
330 Core
500 Heating Target
S Clearance

The invention claimed is:

1. A tubular heater comprising:
a tubular elastic body having a continuous outer peripheral wall without a break or a gap; and
a flexible printed circuit board provided integrally with the elastic body and formed with a heating circuit, wherein
a heating unit of the flexible printed circuit board formed with the heating circuit is provided in the elastic body in a state in which the heating unit is exposed on an inner peripheral side and extends along an innermost peripheral surface of the elastic body with tip ends of the heating unit being separated from each other with a clearance in a circumferential direction, and
the elastic body includes a protrusion that protrudes into the clearance.

2. A tubular heater comprising:
a tubular elastic body having a continuous outer peripheral wall without a break or a gap; and
a flexible printed circuit board provided integrally with the elastic body and formed with a heating circuit, wherein
a heating unit of the flexible printed circuit board formed with the heating circuit is provided in the elastic body in a state in which the heating unit is exposed on an inner peripheral side and extends along an innermost peripheral surface of the elastic body with end surfaces of the heating unit facing each other with a clearance along a circumferential direction of the innermost peripheral surface, and
the elastic body includes a protrusion that protrudes into the clearance.

* * * * *